(12) United States Patent
Lee et al.

(10) Patent No.: US 10,434,629 B2
(45) Date of Patent: Oct. 8, 2019

(54) ROUGHENED SUBSTRATE SUPPORT

(71) Applicant: Applied Materials, Inc., Santa Clara, CA (US)

(72) Inventors: Dongsuh Lee, Santa Clara, CA (US); William N. Sterling, Santa Clara, CA (US); Beom Soo Park, San Jose, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 563 days.

(21) Appl. No.: 14/675,379

(22) Filed: Mar. 31, 2015

(65) Prior Publication Data

US 2015/0202739 A1     Jul. 23, 2015

Related U.S. Application Data

(63) Continuation of application No. 13/944,357, filed on Jul. 17, 2013, now abandoned.

(60) Provisional application No. 61/676,790, filed on Jul. 27, 2012.

(51) Int. Cl.
| | |
|---|---|
| *B24C 1/06* | (2006.01) |
| *B24C 1/00* | (2006.01) |
| *H01L 21/687* | (2006.01) |
| *C23C 16/458* | (2006.01) |

(52) U.S. Cl.
CPC .............. *B24C 1/06* (2013.01); *B24C 1/00* (2013.01); *C23C 16/4581* (2013.01); *H01L 21/68757* (2013.01)

(58) Field of Classification Search
CPC ......... B24C 1/00; B24C 1/06; C23C 14/4581; H01L 21/68757
USPC ........................................................ 451/38
See application file for complete search history.

(56) References Cited

U.S. PATENT DOCUMENTS

| | | | |
|---|---|---|---|
| 2,276,594 A | 3/1942 | Rowell | |
| 2,929,120 A | 3/1960 | Brandt et al. | |
| 5,271,188 A | 12/1993 | Yoshikawa | |
| 5,423,713 A * | 6/1995 | Mishima | ............... B24C 3/322 |
| | | | 451/102 |

(Continued)

FOREIGN PATENT DOCUMENTS

| | | |
|---|---|---|
| CN | 101312225 | 11/2008 |
| CN | 101353786 A | 1/2009 |

(Continued)

OTHER PUBLICATIONS

Chinese Office Action dated May 12, 2016 for Application No. 201380037798.0.

(Continued)

*Primary Examiner* — George B Nguyen
(74) *Attorney, Agent, or Firm* — Patterson + Sheridan LLP

(57) ABSTRACT

The present disclosure generally relates to a substrate support for use in a substrate processing chamber. A roughened substrate support reduces arcing within the chamber and also contributes to uniform deposition on the substrate. A substrate support may have a substrate support body having a surface roughness of between about 707 micro-inches and about 834 micro-inches. The substrate support may have an anodized coating on the substrate support.

10 Claims, 5 Drawing Sheets

(56) References Cited

U.S. PATENT DOCUMENTS

| | | | |
|---|---|---|---|
| 5,833,517 A * | 11/1998 | Konda | B24C 1/04 451/29 |
| 5,839,945 A | 11/1998 | Elliott | |
| 6,042,151 A | 3/2000 | Ali | |
| 6,805,952 B2 | 10/2004 | Chang et al. | |
| 6,808,439 B2 | 10/2004 | Carpenter | |
| 6,933,025 B2 | 8/2005 | Lin et al. | |
| 6,957,511 B1 | 10/2005 | Leigh et al. | |
| 7,221,553 B2 | 5/2007 | Nguyen et al. | |
| 7,585,201 B2 | 9/2009 | Kanai et al. | |
| 7,768,765 B2 | 8/2010 | Nguyen et al. | |
| 8,257,146 B2 | 9/2012 | Antolotti et al. | |
| 8,877,301 B2 * | 11/2014 | Furuta | C23C 16/4585 118/723 E |
| 2003/0181065 A1 * | 9/2003 | O'Donnell | C23C 4/02 438/778 |
| 2004/0099285 A1 | 5/2004 | Wang et al. | |
| 2004/0221959 A1 | 11/2004 | Choi et al. | |
| 2005/0048876 A1 * | 3/2005 | West | C23C 14/564 451/37 |
| 2006/0009133 A1 | 1/2006 | Hashimoto et al. | |
| 2006/0032586 A1 | 2/2006 | Choi et al. | |
| 2006/0194527 A1 | 8/2006 | Hawkins | |
| 2006/0283552 A1 * | 12/2006 | Rogers | H01J 37/32477 156/345.33 |
| 2008/0289686 A1 * | 11/2008 | Won | H01L 31/022466 136/256 |
| 2008/0289687 A1 * | 11/2008 | Won | H01L 31/022466 136/256 |
| 2010/0124872 A1 | 5/2010 | Hashish et al. | |
| 2010/0321783 A1 * | 12/2010 | Hirabayashi | B24C 1/08 359/599 |
| 2011/0135877 A1 | 6/2011 | Ullerich et al. | |

FOREIGN PATENT DOCUMENTS

| | | |
|---|---|---|
| JP | 6-143143 | 5/1994 |
| JP | 03-189432 B2 | 7/2001 |
| JP | 2006-049352 A | 2/2006 |
| JP | 2007-051367 A | 3/2007 |
| KR | 2005-0054317 A | 6/2005 |
| KR | 2009-0010625 A | 1/2009 |

OTHER PUBLICATIONS

International search report and written opinion for PCT/US2013/050365 dated Oct. 18, 2013.
Office Action for U.S. Appl. No. 13/944,357 dated Feb. 25, 2015.
Chinese Office Action dated Jun. 2, 2017 for Application No. 201380037798.0.
Taiwan Office Action in related application TW 102125972 dated Apr. 17, 2017.
Chinese Office Action dated Nov. 10, 2017 for Application No. 201380037798.0.
Chinese Office Action dated Apr. 25, 2018 for Application No. 201380037798.0.
Chinese Office Action dated Jun. 5, 2019 for Application No. 201380037798.0.

* cited by examiner

ROUGHENED SUBSTRATE SUPPORT

CROSS-REFERENCE TO RELATED APPLICATIONS

This application is a divisional of copending U.S. patent application Ser. No. 13/944,357, filed Jul. 17, 2013, which claims benefit of U.S. Provisional Patent Application Ser. No. 61/676,790, filed Jul. 27, 2012, which is incorporated herein by reference.

BACKGROUND

Field

Embodiments of the present disclosure generally relate to a substrate support for use in a substrate processing chamber.

Description of the Related Art

Plasma enhanced chemical vapor deposition (PECVD) is generally employed to deposit thin films on a substrate such as a flat panel or semiconductor wafer. PECVD is generally accomplished by introducing a precursor gas into a vacuum chamber that contains a substrate. The precursor gas is typically directed through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of the substrate that is positioned on a temperature controlled substrate support.

During processing, small local variations in film thickness, often manifesting as spots of thinner film thickness, have been observed which may be detrimental to the device produced. It is believed that variation is glass thickness and flatness, along with a smooth substrate support surface, creates a local capacitance variation in certain locations across the substrate, thereby creating local plasma non-uniformities that leads in deposition variations, e.g., thin spots.

Therefore, there is a need for an improved substrate support.

SUMMARY

The present disclosure generally relates to a substrate support for use in a substrate processing chamber. A roughened substrate support reduces arcing within the chamber and also contributes to uniform deposition on the substrate.

In one embodiment, a substrate support has a substrate support body having a surface roughness of between about 707 micro-inches and about 834 micro-inches. The substrate support may have an anodized coating on the substrate support.

In one embodiment, a substrate support has a roughened substrate support body. The roughened substrate support body may be formed by a bead blasting process. The bead blasting process may comprise bead blasting a surface of the substrate support in a first process where the beads have a first grit size and bead blasting the surface of the substrate support in a second process where the beads have a second grit size that is smaller than the first grit size. The second process may further comprise scanning a nozzle across the surface of the substrate support in a first direction. The second process may further comprise shifting the nozzle along the surface of the substrate support in a second direction. The second process may further comprise scanning the nozzle across the surface of the substrate support in a third direction. The second process may further comprise rotating the substrate support about 90 degrees, scanning the nozzle across the surface of the substrate support in the first direction, shifting the nozzle along the surface of the substrate support in the second direction, and scanning the nozzle across the surface of the substrate support in the third direction.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this invention and are therefore not to be considered limiting of its scope, for embodiments of the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to a substrate support for use in a substrate processing chamber. A roughened substrate support reduces arcing within the chamber and also contributes to uniform deposition on the substrate. The roughening can occur in two steps. In a first step, the substrate support is bead blasted to initially roughen the surfaces. Then, the roughened surface is bead blasted with a finer grit to produce a substrate support with a surface roughness of between about 707 micro-inches and about 837 micro-inches. Following the surface roughening, the substrate support is anodized.

The description herein will be made with reference to a PECVD chamber available from AKT America, Inc., a subsidiary of Applied Materials, Inc., Santa Clara, Calif. It is to be understood that the embodiments herein are equally applicable to other processing chambers as well, including processing chamber sold by other manufacturers.

Figure 1:
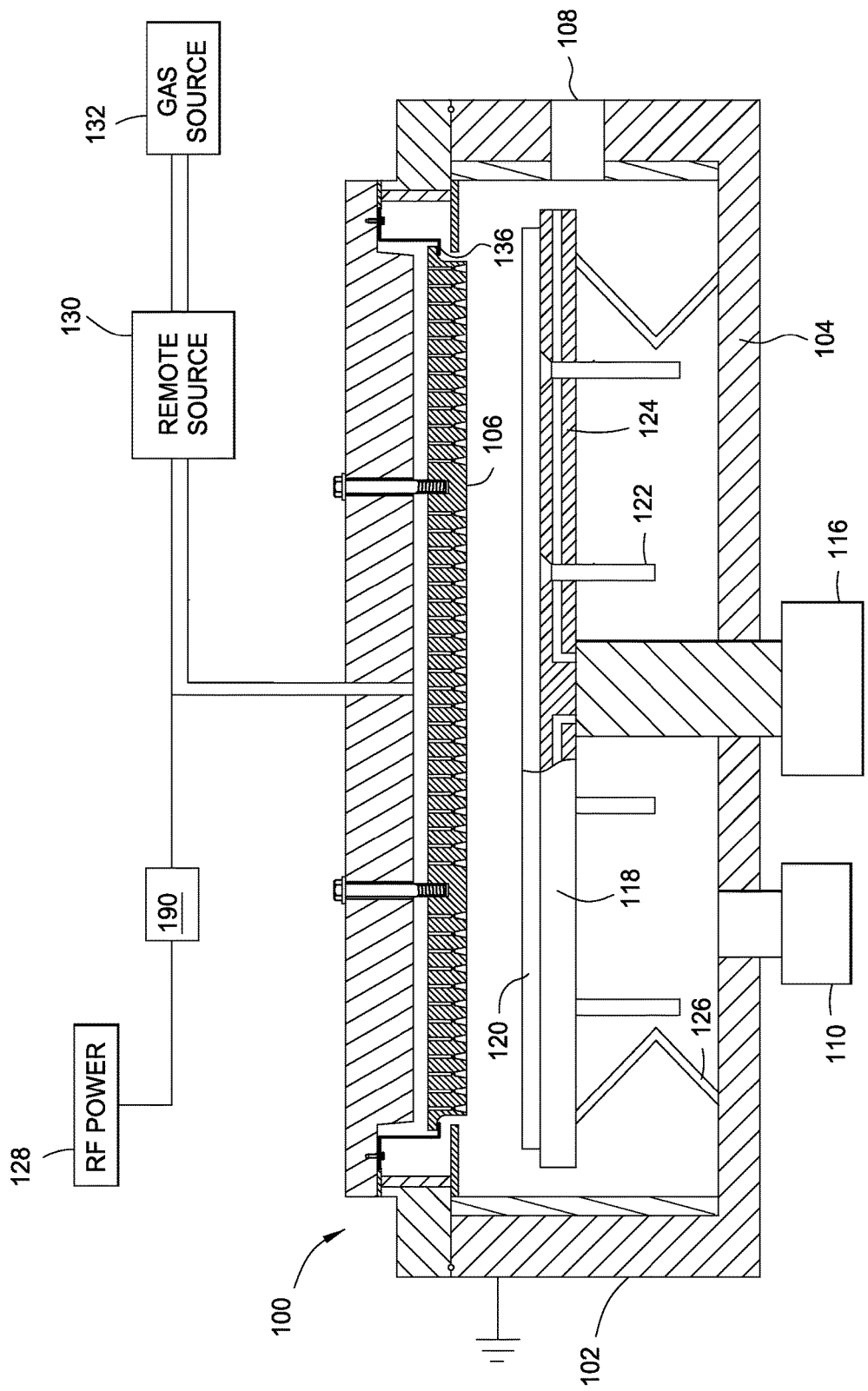
FIG. 1 is a cross sectional view of a PECVD apparatus according to one embodiment.

FIG. 1 is a cross sectional view of a PECVD apparatus that may utilize the substrate support described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 may also include RF return straps 126 to provide an RF return path at the periphery of the substrate support 118.

The showerhead 106 is coupled to a backing plate 112 by a fastening mechanism 150. The showerhead 106 may be coupled to the backing plate 112 by one or more fastening mechanisms 150 to help prevent sag and/or control the straightness/curvature of the showerhead 106.

A gas source 132 is coupled to the backing plate 112 to provide gas through gas passages in the showerhead 106 to a processing area between the showerhead 106 and the substrate 120. A vacuum pump 110 is coupled to the chamber 100 to control the process volume at a desired pressure. An RF source 128 is coupled through a match network 190 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 2:
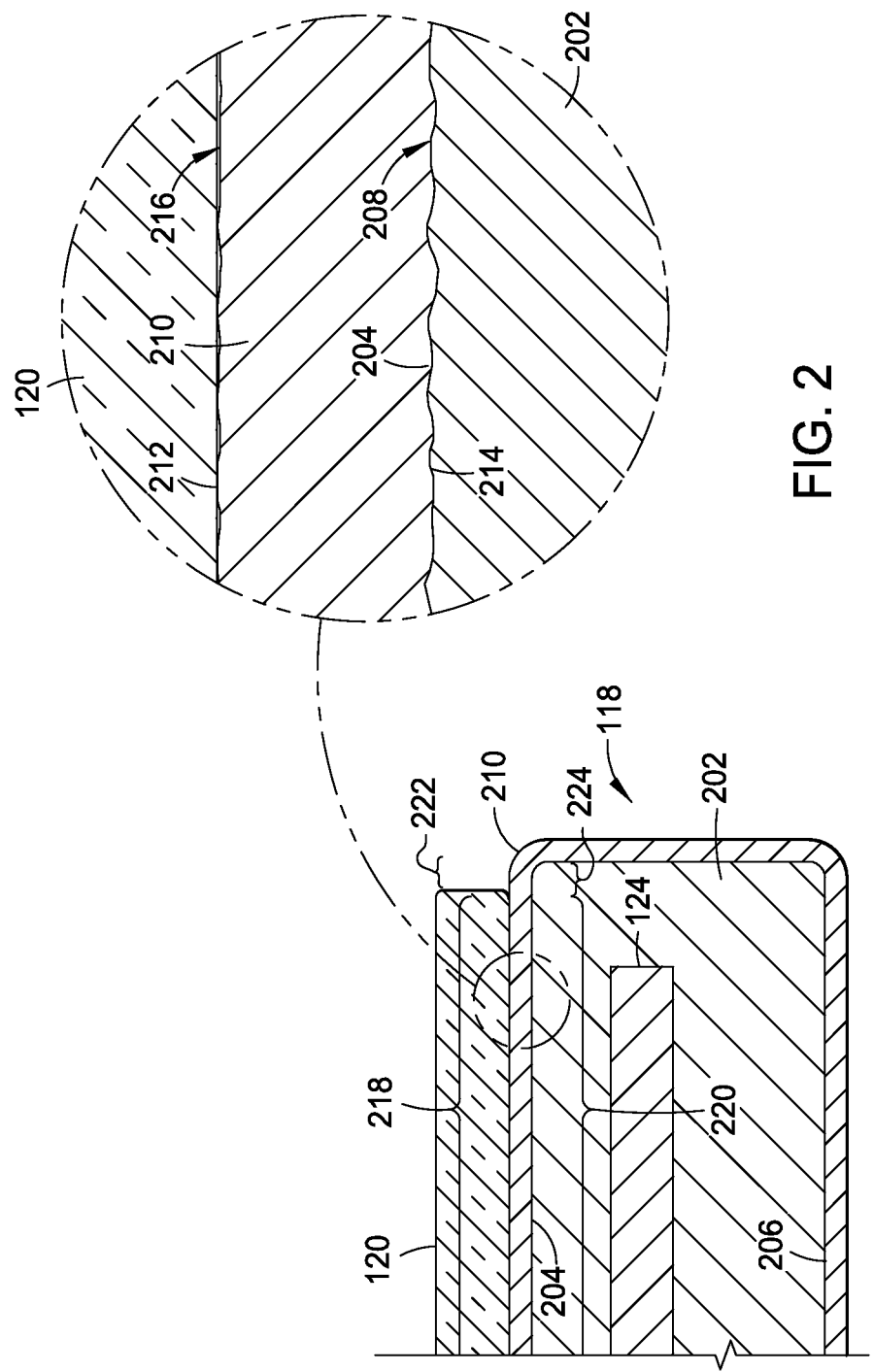
FIG. 2 is a partial sectional view of a substrate support according to one embodiment.

FIG. 2 is a partial sectional view of the substrate support 118. The substrate support 118 includes a body 202 substantially covered with an anodized coating 210. The body 202 may be comprised of one or more coupled members or a unitary casted body having the heating and/or cooling elements 124 embedded therein. In one embodiment, the body 202 may comprise aluminum.

The body 202 generally includes a substrate support surface 204 and an opposing mounting surface 206. The anodized coating 210 covers at least the support surface 204 of the body 202 and provides a separating layer between the substrate 120 and the support surface 204.

The coating 210 includes an outer surface 212 and an inner surface 214. The inner surface 214 is generally disposed directly on the body 202. In one embodiment, the anodized coating has a thickness of between about 23 μm to about 27 μm, such as about 25 μm. The inner surface 214 has a surface roughness that translates to the anodized coating 210. A portion 218 of the outer surface 212 positioned above the substrate support surface 204 has a geometry configured to support the substrate 120 thereon. The portion 218 of the outer surface 212 has a surface finish 216 of a predefined roughness that promotes uniform thickness of films deposited on the substrate 140. The surface finish 216 has a roughness of about 707 micro-inches to about 847 micro-inches, such as about 777 micro-inches. The surface finish 216 advantageously results in improved film thickness uniformity.

The surface finish 216 of the anodized coating 210 may be achieved by treating at least a portion 220 of the outer substrate support surface 204 underlying the substrate 140 as will be discussed below. The surface finish 208 of the substrate support surface 204 may be formed in a number of manners, including bead blasting, abrasive blasting, grinding, embossing, sanding, texturing, etching or other method for providing a pre-defined surface roughness. In one embodiment, the surface finish 208 of the support surface 204 of the body 202 is about 707 micro-inches to about 847 micro-inches, such as about 777 micro-inches.

Optionally, a strip 224 of the support surface 204 bounding the portion 220 positioned out from under the substrate 120 may be left untreated to minimize the fabrication costs. This results in a strip 222 of the anodized coating 210 above the untreated strip 224 that may have a finish different than the finish 216, but as the strip 222 is beyond the substrate 120, the surface finish of the strip 222 has no effect on film deposition uniformity. In one embodiment, the strip 222 of the anodized coating 210 has a smoother surface finish than the portion 218 of the coating 210 it bounds.

Figure 3A:
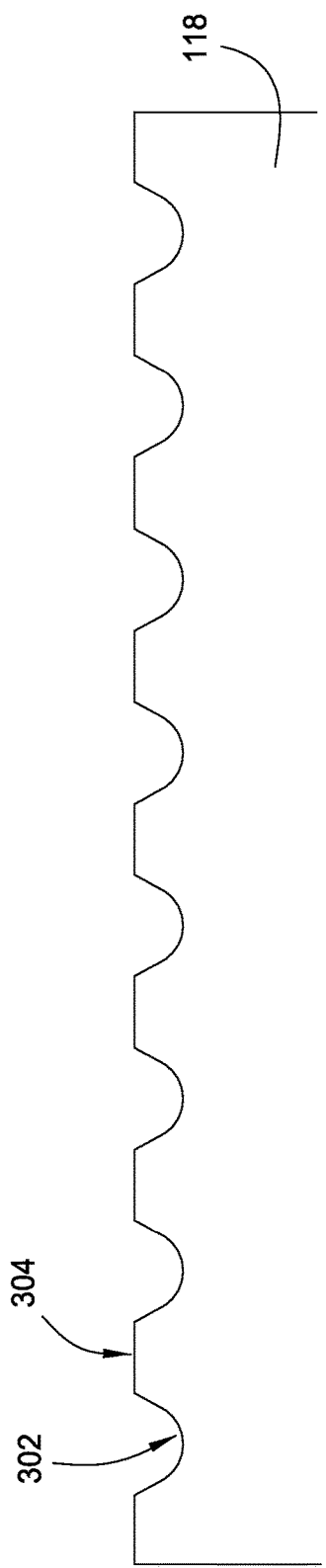
FIG. 3A is a schematic cross-sectional view of substrate support after a first step of roughening according to one embodiment.

In order to roughen the substrate support 118, a two step process may occur. FIG. 3A is a schematic cross-sectional view of substrate support 118 after a first step of roughening according to one embodiment. In the first step of the process, the substrate support is exposed to a first bead blasting process to form valleys 302 within the substrate support 118 separated by plateaus 304. The bead blasting may occur by exposing the substrate support 118 to beads ejected from a nozzle 402.

Figure 4:
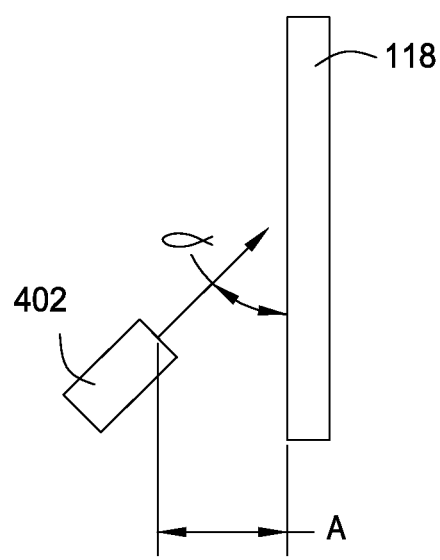
FIG. 4 is a schematic illustration of a roughing instrument relative to a substrate support according to one embodiment.

FIG. 4 is a schematic illustration of a roughing instrument (e.g., nozzle 402) relative to a substrate support 118 according to one embodiment. The nozzle 402 may be disposed at an angle α relative to the surface of the substrate support 118 that is being bead blasted. The angle α may be between about 85 degrees and about 95 degrees, for example, 90 degrees. The nozzle 402 may be spaced from the substrate support 118 by a distance "A" of between about 400 mm and about 600 mm. The beads for the bead blasting may have a first grit size of between about 23 grit and about 25 grit, for example 24 grit. The beads used are spherical beads.

Figure 5A:
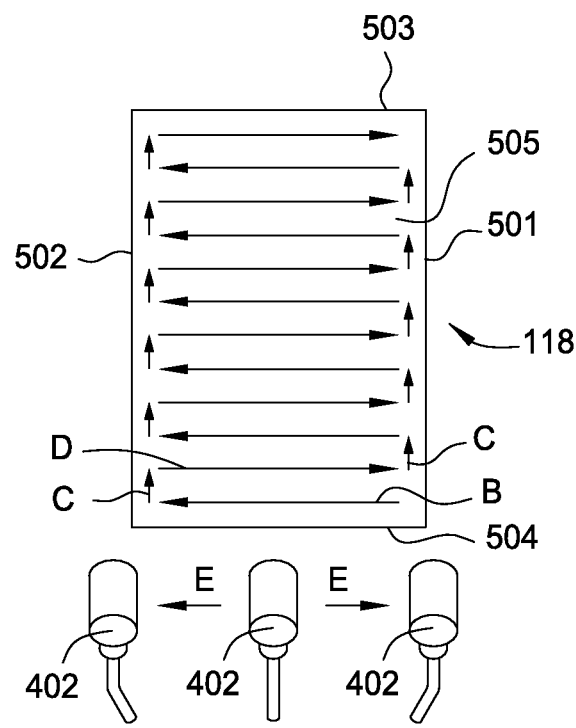
FIG. 5A is a schematic illustration of a substrate support being roughened in first step according to one embodiment.

In operation, the nozzle 402 scans over the substrate support 118, however, it is contemplated that the substrate support 118 can move relative to the nozzle 402 or both the nozzle 402 and substrate support 118 may move. FIG. 5A is a schematic illustration of the substrate support 118 being roughened in first step according to one embodiment. As shown, the substrate support 118 has is has a generally rectangular shape such that four sides 501-504 are present.

The nozzle 402 moves laterally as shown by arrows "E" and scans across the surface 505 of the substrate support 118 in a first direction from a first side 501 to a second side 502 as shown by arrow "B". Thereafter, the nozzle 402 shifts in a second direction that is perpendicular to the first direction as shown by arrow "C". The nozzle 402 then ejects the beads towards the surface 505 as the nozzle 402 moves in a third direction opposite the first direction from second side 502 to first side 501 as shown by arrow "D". The nozzle 402 then shifts again in the second direction as shown by arrow "C".

When the nozzle 402 shifts, the nozzle shifts a distance of between about 20 mm and about 40 mm. Thus, the nozzle 402 follows a serpentine pattern to expose the entire surface 505 to bead blasting.

Figure 3B:
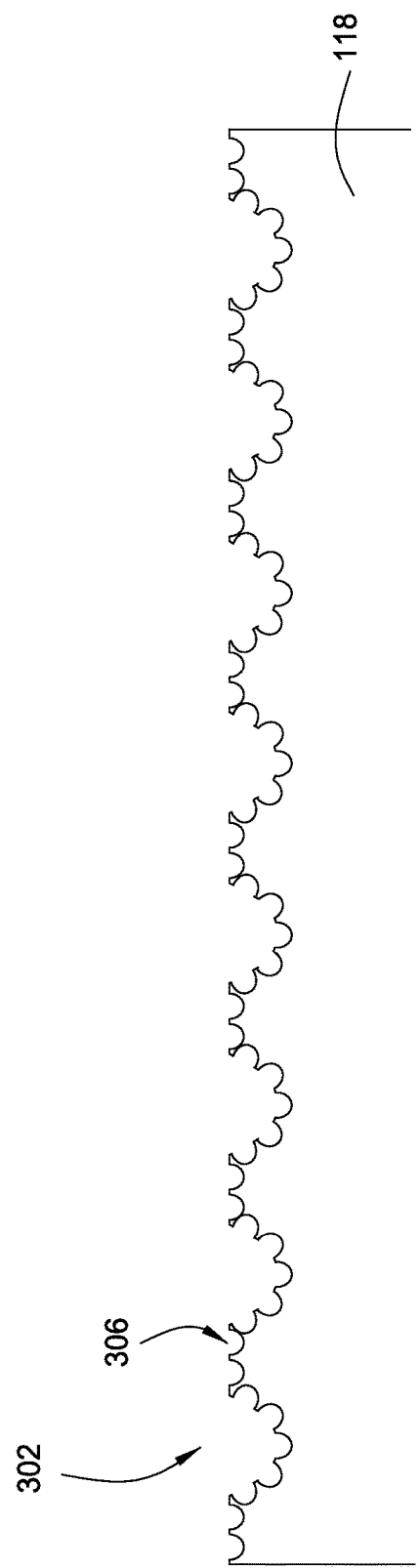
FIG. 3B is a schematic cross-sectional view of the substrate support of FIG. 3A after a second step of roughening according to one embodiment.

Following the first bead blasting process, the substrate support 118 is roughened as shown in FIG. 3A, but the surface 505 is not sufficiently rough. Additionally, during substrate 120 placement onto the substrate support 118 and during processing, gas may be trapped within the valleys 302 and be unable to escape because the plateaus 304 contact the substrate 120 and prevent gas from escaping the valleys 302. Therefore, the substrate support 118 is bead blasted in a second process to roughen the plateaus 304 and further roughen the valleys 302. FIG. 3B is a schematic cross-sectional view of the substrate support 118 of FIG. 3A after a second step of roughening according to one embodiment. As shown in FIG. 3B, the plateaus 304 are no longer present, but rather, a roughened surface 306 is present. Following the second bead blasting process, the surface roughness of the substrate support 118 may be between about 707 micro-inches and about 837 micro-inches, for example 777 micro-inches. Because a grit size of between about 58 grit and about 61 grit, such as 60 grit, is utilized, rough peaks/edges on the substrate support 118 are few and far between. Peaks/edges are sharp points where the substrate 120 will contact the substrate support 118 and can lead to arcing between the substrate 120 and substrate support 118, as well as scratching of the substrate 120. Additionally, due to the uneven surface and lack of plateaus, gas that may otherwise be trapped between the substrate support 118 and substrate 120 may freely be evacuated from between the substrate support 118 and substrate 120. The beads used are spherical beads.

FIG. 5B-5E are schematic illustrations of the substrate support 118 of FIG. 5A being roughened in the second process according to one embodiment. The second process spaces the nozzle 402 from the substrate support 118 by the same distance and at the same angle as in the first process. The second process has four separate steps in the case of a rectangular shaped substrate support 118.

Figure 5B:
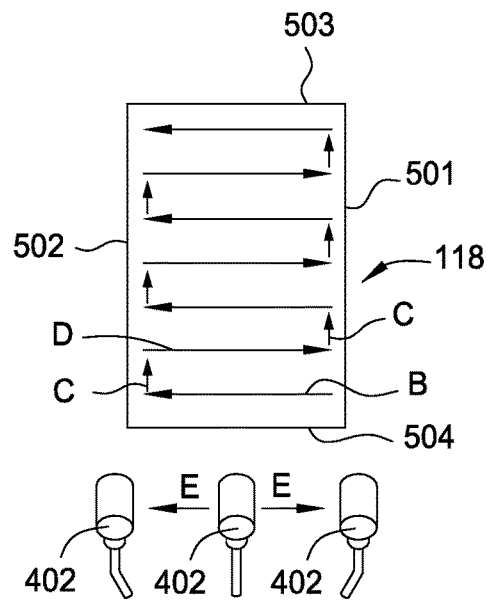
FIG. 5B-5E are schematic illustrations of the substrate support of FIG. 5A being roughened in a second step according to one embodiment.

In the first step of the second process, shown in FIG. 5B, the nozzle 402 scans across the substrate support 118 in a manner similar to the first process. Namely, the nozzle 402 scans in the first direction from the first side 501 to the second side 502 as shown by arrow "B". Then, the nozzle shifts as shown by arrows "C" in the second direction towards the third side 503. Thereafter, the nozzle scans in the third direction from the second side 502 to the first side 501 as shown by arrows "D". The nozzle 402 then shifts again in the second direction as shown by arrows "C". When the nozzle 402 shifts, the nozzle shifts a distance of between about 20 mm and about 40 mm. Thus, the nozzle 402 follows a serpentine pattern to expose the entire surface 505 to bead blasting.

Figure 5C:
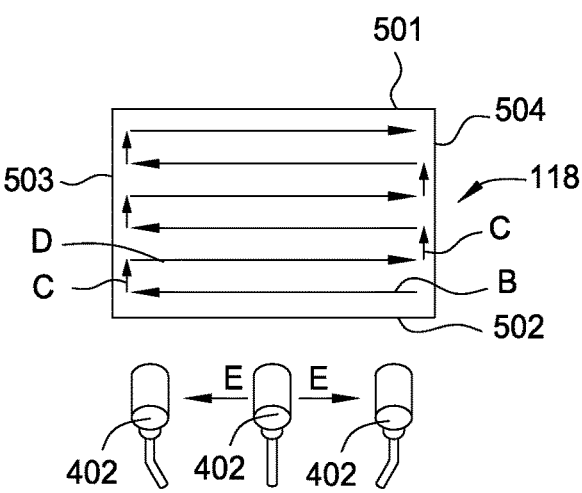

In the second step, shown in FIG. 5C, the substrate support 118 is rotated counterclockwise about 90 degrees. It is to be understood that rather than counterclockwise, the substrate support 118 may be rotated clockwise. Following the rotation, the nozzle 402 scans in the first direction from a fourth side 504 to the third side 503 as shown by arrow "B". Then, the nozzle shifts as shown by arrows "C" in the second direction towards the first side 501. Thereafter, the nozzle scans in the third direction from the third side 503 to the fourth side 504 as shown by arrows "D". The nozzle 402 then shifts again in the second direction as shown by arrows "C". When the nozzle 402 shifts, the nozzle shifts a distance of between about 20 mm and about 40 mm. Thus, the nozzle 402 follows a serpentine pattern to expose the entire surface 505 to bead blasting.

Figure 5D:
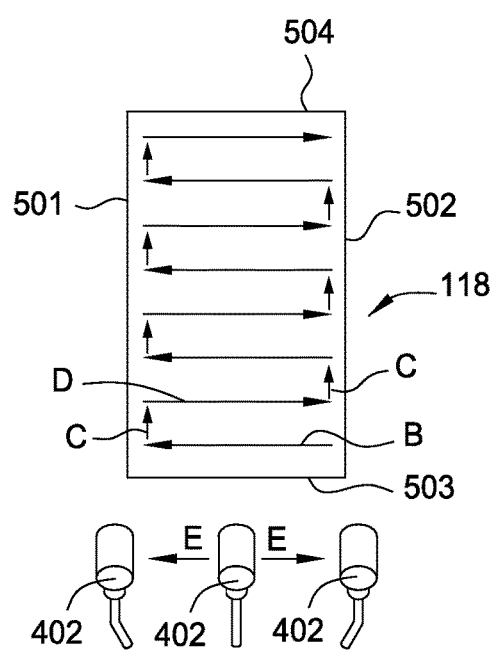

In the third step, shown in FIG. 5D, the substrate support 118 is rotated counterclockwise about 90 degrees. It is to be understood that rather than counterclockwise, the substrate support 118 may be rotated clockwise so long as the rotation for the third step is in the same direction as in the second step. Following the rotation, the nozzle 402 scans in the first direction from the second side 502 to the first side 501 as shown by arrow "B". Then, the nozzle shifts as shown by arrows "C" in the second direction towards the fourth side 504. Thereafter, the nozzle scans in the third direction from the first side 501 to the second side 502 as shown by arrows "D". The nozzle 402 then shifts again in the second direction as shown by arrows "C". When the nozzle 402 shifts, the nozzle shifts a distance of between about 20 mm and about 40 mm. Thus, the nozzle 402 follows a serpentine pattern to expose the entire surface 505 to bead blasting.

Figure 5E:
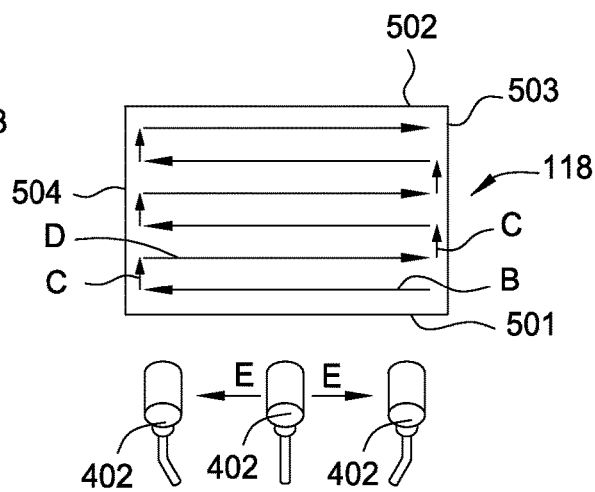

In the fourth step, shown in FIG. 5E, the substrate support 118 is rotated counterclockwise about 90 degrees. It is to be understood that rather than counterclockwise, the substrate support 118 may be rotated clockwise so long as the rotation for the third step is in the same direction as in the second step. Following the rotation, the nozzle 402 scans in the first direction from the third side 503 to the fourth side 504 as shown by arrow "B". Then, the nozzle shifts as shown by arrows "C" in the second direction towards the second side 502. Thereafter, the nozzle scans in the third direction from the fourth side 504 to the third side 503 as shown by arrows "D". The nozzle 402 then shifts again in the second direction as shown by arrows "C". When the nozzle 402 shifts, the nozzle shifts a distance of between about 20 mm and about 40 mm. Thus, the nozzle 402 follows a serpentine pattern to expose the entire surface 505 to bead blasting.

Now that the second bead blasting process is complete, the substrate support 118 has a surface 505 with a roughness of between about 707 micro-inches to about 837 micro-inches, for example 777 micro-inches. Following the bead blasting process, the substrate support 118 is anodized to form an anodized coating 210 thereover to a thickness of between about 23 µm to about 27 µm, for example, 25 µm.

The roughened substrate support 118 reduces or eliminates arcing between the substrate support 118 and the substrate 120. Additionally, the roughened substrate support 118 reduces or eliminates thin spots during the deposition onto the substrate 120 such that a substantially uniformly thick layer may be deposited onto the substrate 120. Even though the substrate support 118 is roughened, the substrate support 118 does not substantially scratch the substrate.

While the foregoing is directed to embodiments of the present invention, other and further embodiments of the invention may be devised without departing from the basic scope thereof, and the scope thereof is determined by the claims that follow.

The invention claimed is:

1. A substrate support, comprising:
   a substrate support body having a surface roughness of between about 707 micro-inches and about 834 micro-inches; and
   an anodized coating on the substrate support, wherein the surface roughness of the substrate support body translates to the anodized coating.

2. The substrate support of claim 1, wherein the substrate support body comprises aluminum.

3. The substrate support of claim 1, wherein the anodized coating is between about 23 µm thick and about 27 µm thick.

4. The substrate support of claim 1, wherein the substrate support body has an inner surface, wherein the inner surface has a surface roughness, wherein the surface roughness translates to the anodized coating.

5. The substrate support of claim 1, further comprising a substrate, wherein the anodized coating has an outer surface having a surface finish configured to promote uniform thickness of films deposited on the substrate.

6. The substrate support of claim 5, wherein the surface finish has a roughness of about 707 micro-inches to about 847 micro-inches.

7. The substrate support of claim 1, wherein the substrate support body comprises roughened plateaus and roughened valleys.

8. The substrate support of claim 1, wherein the substrate support body comprises peaks and edges for contacting a substrate.

9. A substrate support comprising a roughened substrate support body, the roughened substrate support body formed by a bead blasting process, the bead blasting process comprising:
   bead blasting a surface of the substrate support in a first process where the beads have a first grit size;
   bead blasting the surface of the substrate support in a second process where the beads have a second grit size that is smaller than the first grit size, wherein the second process further comprises:
      scanning a nozzle across the surface of the substrate support in a first direction;
      shifting the nozzle along the surface of the substrate support in a second direction;
      scanning the nozzle across the surface of the substrate support in a third direction;
      rotating the substrate support about 90 degrees;
      scanning the nozzle across the surface of the substrate support in the first direction;
      shifting the nozzle along the surface of the substrate support in the second direction; and
      scanning the nozzle across the surface of the substrate support in the third direction; and
   anodizing the substrate support body to form an anodized coating, wherein the bead blasted surface of the roughened substrate support body translates to the anodized coating, and wherein the roughened substrate support body has a surface roughness of between about 707 micro-inches and about 834 micro-inches.

10. A substrate support comprising a roughened substrate support body and a substrate, the roughened substrate support body formed by a bead blasting process, the bead blasting process comprising:
   bead blasting a surface of the substrate support in a first process where the beads have a first grit size;
   bead blasting the surface of the substrate support in a second process where the beads have a second grit size that is smaller than the first grit size, wherein the second process further comprises:
      scanning a nozzle across the surface of the substrate support in a first direction;
      shifting the nozzle along the surface of the substrate support in a second direction;
      scanning the nozzle across the surface of the substrate support in a third direction;
      rotating the substrate support about 90 degrees;
      scanning the nozzle across the surface of the substrate support in the first direction;
      shifting the nozzle along the surface of the substrate support in the second direction; and
      scanning the nozzle across the surface of the substrate support in the third direction; and
   anodizing the substrate support body to form an anodized coating, wherein the bead blasted surface of the roughened substrate support body translates to the anodized coating,
   wherein the anodized coating has an outer surface having a surface finish configured to promote uniform thickness of films deposited on the substrate, and
   wherein the surface finish has a roughness of about 707 micro-inches to about 847 micro-inches.

* * * * *